(12) United States Patent
Lee et al.

(10) Patent No.: US 9,190,340 B2
(45) Date of Patent: Nov. 17, 2015

(54) SEMICONDUCTOR DEVICE AND METHOD OF FORMING RF FEM AND RF TRANSCEIVER IN SEMICONDUCTOR PACKAGE

(75) Inventors: YongTaek Lee, Seoul (KR); HyunTai Kim, Kyungki Do (KR); Gwang Kim, Kyungki Do (KR); ByungHoon Ahn, Kyungki-Do (KR); Kai Liu, Phoenix, AZ (US)

(73) Assignee: STATS ChipPAC, Ltd., Singapore (SG)

( * ) Notice: Subject to any disclaimer, the term of this patent is extended or adjusted under 35 U.S.C. 154(b) by 996 days.

(21) Appl. No.: 13/163,026

(22) Filed: Jun. 17, 2011

(65) Prior Publication Data

US 2012/0319302 A1 Dec. 20, 2012

(51) Int. Cl.
| | |
|---|---|
| *H01L 23/28* | (2006.01) |
| *H01L 23/31* | (2006.01) |
| *H01L 21/56* | (2006.01) |
| *H01L 25/065* | (2006.01) |
| *H01L 23/64* | (2006.01) |
| *H01L 23/66* | (2006.01) |
| *H01L 25/16* | (2006.01) |
| *H01L 23/498* | (2006.01) |

(52) U.S. Cl.
CPC .......... *H01L 23/3121* (2013.01); *H01L 21/565* (2013.01); *H01L 23/3128* (2013.01); *H01L 23/645* (2013.01); *H01L 23/66* (2013.01); *H01L 25/0652* (2013.01); *H01L 25/16* (2013.01); *H01L 23/49822* (2013.01); *H01L 2223/6672* (2013.01); *H01L 2224/16225* (2013.01); *H01L 2224/32145* (2013.01); *H01L 2224/48091* (2013.01); *H01L 2224/48145* (2013.01); *H01L 2224/48227* (2013.01); *H01L 2224/73253* (2013.01); *H01L 2224/73265* (2013.01); *H01L 2224/83191* (2013.01); *H01L 2224/92247* (2013.01); *H01L 2225/06558* (2013.01); *H01L 2924/01322* (2013.01); *H01L 2924/13091* (2013.01); *H01L 2924/15311* (2013.01); *H01L 2924/19107* (2013.01); *H01L 2924/3011* (2013.01)

(58) Field of Classification Search
CPC .............. H01L 2224/32145; H01L 25/0655; H01L 2924/14; H01L 2224/48145; H01L 25/0657; H01L 2924/19105; H01L 2224/48137; H01L 2225/06506; H01L 2924/1421; H01L 23/3121; H01L 23/565
USPC ........... 257/787, E21.502, E23.116, 777, 773
See application file for complete search history.

(56) References Cited

U.S. PATENT DOCUMENTS

| | | | |
|---|---|---|---|
| 7,312,505 B2 | 12/2007 | Kipnis et al. | |
| 2008/0111226 A1* | 5/2008 | White et al. | 257/686 |
| 2008/0159364 A1* | 7/2008 | Rofougaran | 375/219 |

*Primary Examiner* — Wael Fahmy
*Assistant Examiner* — Sarah Salerno
(74) *Attorney, Agent, or Firm* — Robert D. Atkins; Atkins and Associates, P.C.

(57) ABSTRACT

A semiconductor device has a first semiconductor die containing a low pass filter and baluns. The first semiconductor die has a high resistivity substrate. A second semiconductor die including a bandpass filter is mounted to the first semiconductor die. The second semiconductor die has a gallium arsenide substrate. A third semiconductor die including an RF switch is mounted to the first semiconductor die. A fourth semiconductor die includes an RF transceiver. The first, second, and third semiconductor die are mounted to the fourth semiconductor die. The first, second, third, and fourth semiconductor die are mounted to a substrate. An encapsulant is deposited over the first, second, third, and fourth semiconductor die and substrate. A plurality of bond wires is formed between the second semiconductor die and first semiconductor die, and between the third semiconductor die and first semiconductor die, and between the first semiconductor die and substrate.

30 Claims, 12 Drawing Sheets

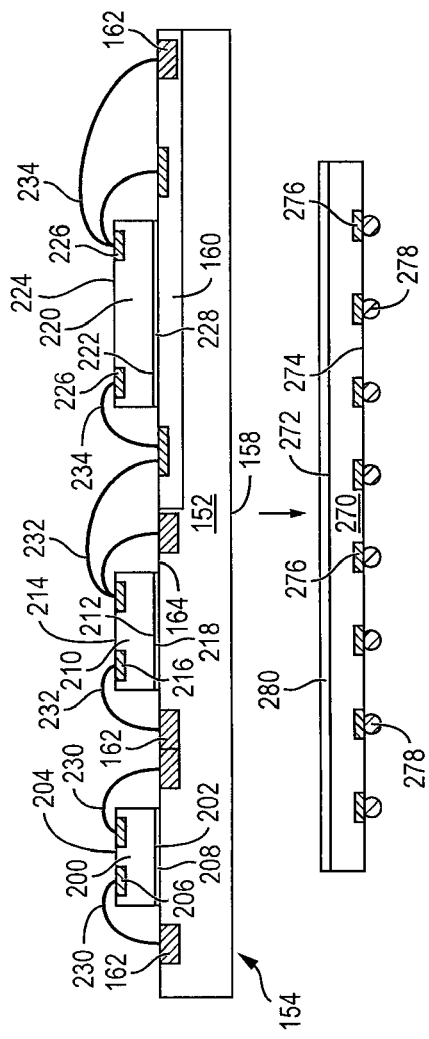
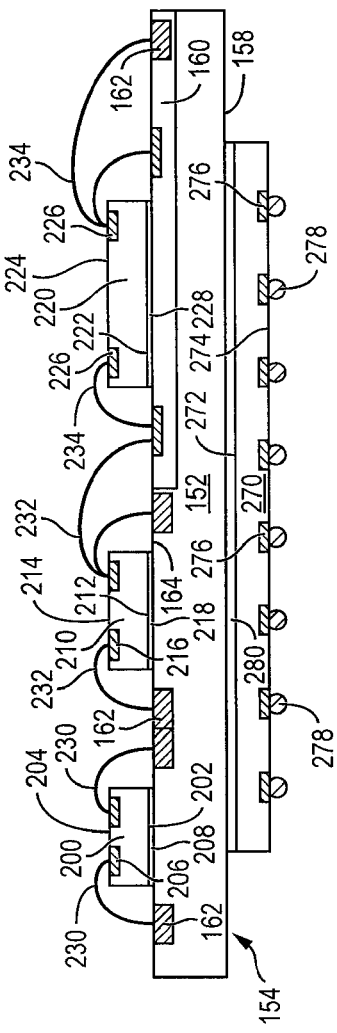
FIG. 7e
FIG. 7f

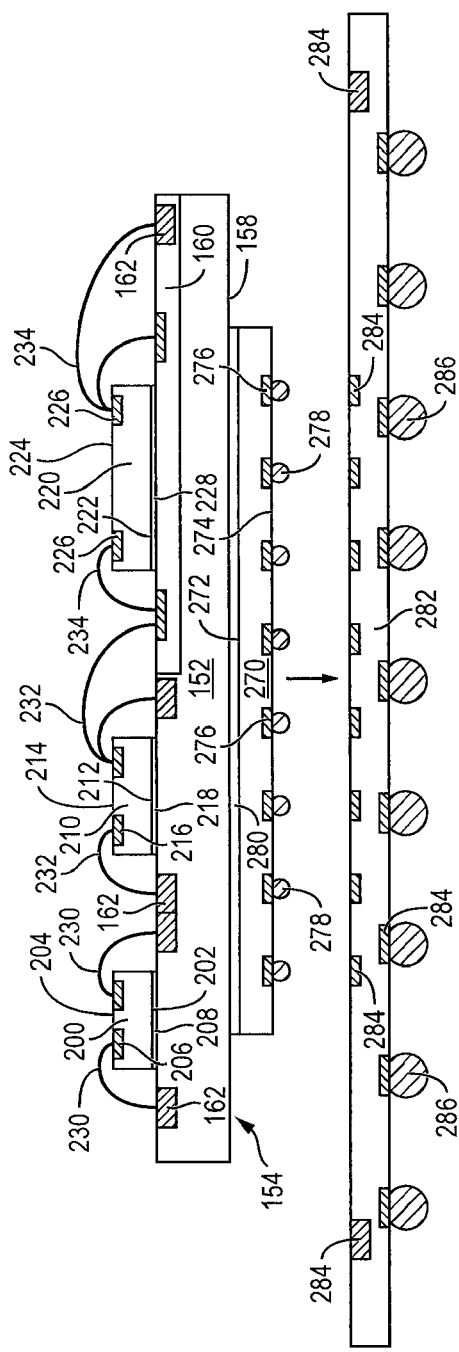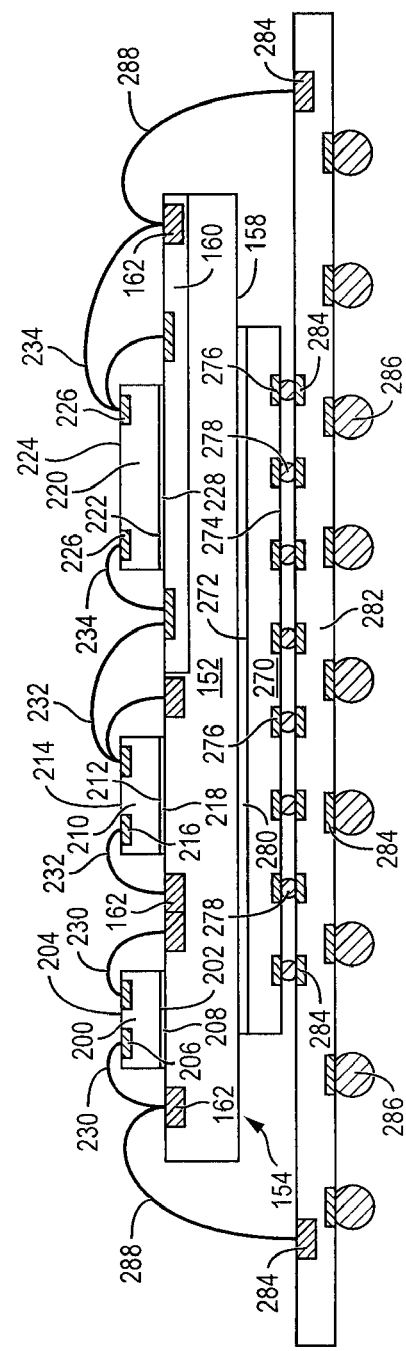

SEMICONDUCTOR DEVICE AND METHOD OF FORMING RF FEM AND RF TRANSCEIVER IN SEMICONDUCTOR PACKAGE

FIELD OF THE INVENTION

The present invention relates in general to semiconductor devices and, more particularly, to a semiconductor device and method of forming an RF FEM and RF transceiver in a semiconductor package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

In a wireless RF system, an RF front end module (FEM) is coupled to an antenna for transmission and reception of wireless RF signals. The RF FEM separates and filters the transmit RF signal and receive RF signal to avoid conflict or cross-over between the RF signals. The separated transmit RF signal and receive RF signal are routed to or received from an RF transceiver for demodulation and conversion to baseband signals for further signal processing. The RF system can be part of a cellular telephone, PDA, or other wireless communication device.

FIG. 1 shows a block diagram of a conventional RF FEM 10 coupled to antenna 12. RF FEM 10 has a transmit section and receive section. In the transmit section, the transmit RF signal from the RF transceiver is routed to an input of power amplifier 14 to increase signal power and amplification. The output of power amplifier 14 is coupled to RF coupler 15 which detects the transmit signal power level. The transmit RF signal is filtered by LC filter 16 and routed to TX/RX switch 18 which switches between the transmit RF signal and receive RF signal. When selected by TX/RX switch 18, the transmit RF signal is routed to diplexer 20 which performs frequency multiplexing from two ports to one port for transmission by antenna 12.

In the receive section, the receive RF signal from antenna 12 is processed through diplexer 20 for frequency de-multiplexing from one port to two ports. When selected by TX/RX switch 18, the receive RF signal is routed to surface acoustic wave (SAW) filter 22. SAW filter 22 converts an electrical signal to a mechanical wave using a piezoelectric crystal or ceramic. The mechanical wave is delayed by the piezoelectric structure to provide a narrow passband response by rejecting out-of-band signals. The filtered wave is converted back to an electrical signal and routed to the RF transceiver as the receive RF signal.

FIG. 2 shows a conventional semiconductor package 23 for implementing RF FEM 10. Substrate 24 is a multilayered low temperature co-fire ceramic (LTCC) laminate with a plurality of internal dielectric layers 26 and conductivity layers 28, such as silver or copper. LTCC substrate 24 includes internal passive components, such as resistor 30, capacitors 32, and inductors 34, as well as embedded RF circuits 36, within the multilayered substrate. A TX/RX switch die 38 and discrete resistor 40 are mounted to a top surface of LTCC substrate 24 and electrically connected to conductive layers 28. A SAW filter die 42 is mounted to LTCC substrate 24 and electrically connected to conductive layers 28. SAW filter 42 is relatively large due to its mechanical features, but can be placed in a recess formed in LTCC substrate 24 in an attempt to reduce the height of semiconductor package 23.

RF FEM 10, as implemented semiconductor package 23 with SAW filter die 42, represents a relatively bulky and complex structure and involves high manufacturing costs. As the demand for smaller packages and lower cost drives the market, additional work is needed to improve the RF FEM design.

SUMMARY OF THE INVENTION

A need exists for an RF FEM without a bulky SAW filter. Accordingly, in one embodiment, the present invention is a method of making a semiconductor device comprising the steps of providing a first semiconductor die including a low pass filter and first and second baluns, providing a second semiconductor die including a bandpass filter formed on a gallium arsenide substrate, mounting the second semiconductor die to the first semiconductor die, providing a third semiconductor die including an RF switch, mounting the third semiconductor die to the first semiconductor die, providing a fourth semiconductor die including an RF transceiver, and mounting the first, second, and third semiconductor die to the fourth semiconductor die.

In another embodiment, the present invention is a method of making a semiconductor device comprising the steps of providing a first semiconductor die including a low pass filter and balun, providing a second semiconductor die including a bandpass filter formed on a gallium arsenide substrate, and mounting the second semiconductor die to the first semiconductor die.

In another embodiment, the present invention is a method of making a semiconductor device comprising the steps of providing a first semiconductor die including a low pass filter and balun, providing a second semiconductor die including a bandpass filter, and mounting the second semiconductor die to the first semiconductor die.

In another embodiment, the present invention is a semiconductor device comprising a first semiconductor die including a low pass filter and balun. A second semiconductor die including a bandpass filter is mounted to the first semiconductor die.

BRIEF DESCRIPTION OF THE DRAWINGS

FIGS. 7a-7j illustrate a process of forming an RF FEM and RF transceiver in a semiconductor package;

DETAILED DESCRIPTION OF THE DRAWINGS

Figure 1:
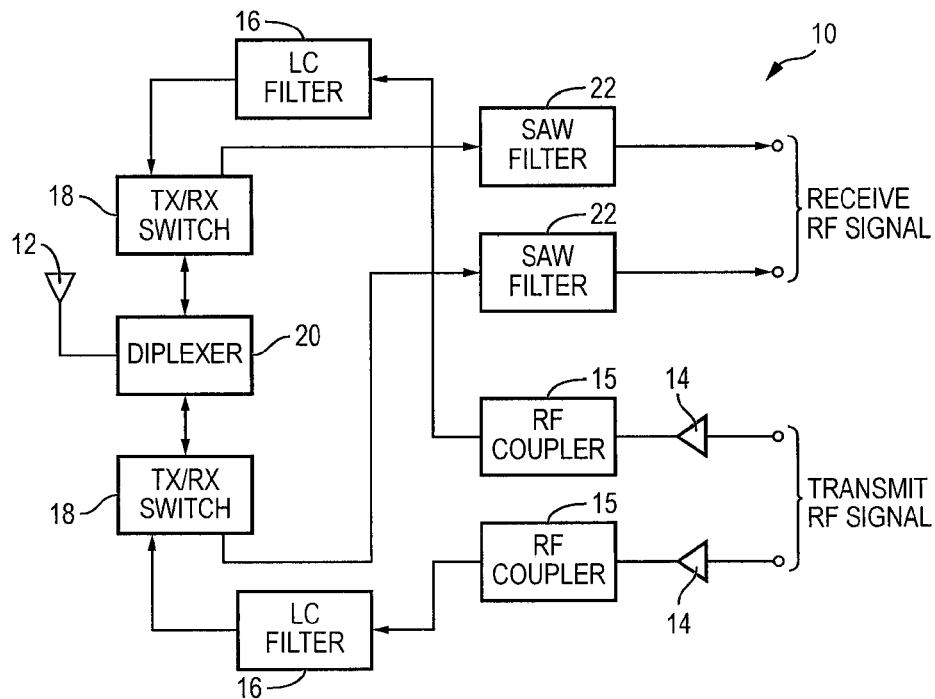
FIG. 1 illustrates a block diagram of a conventional RF FEM with a SAW filter.
Figure 2:
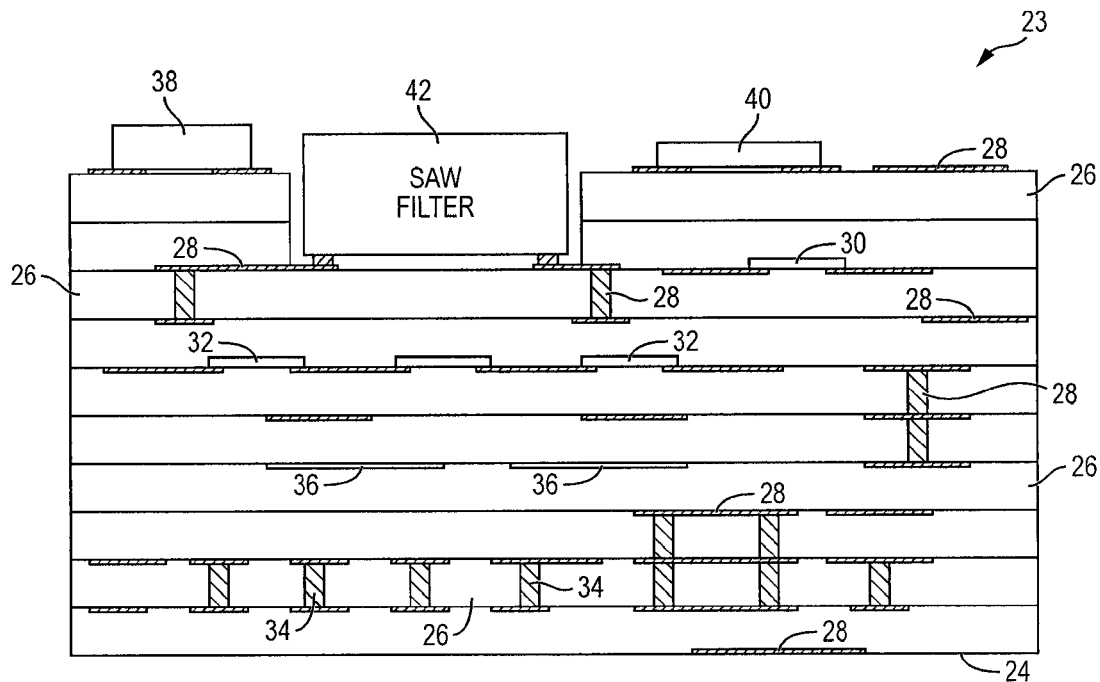
FIG. 2 illustrates a conventional LTCC substrate implementing the RF FEM with the SAW filter of FIG. 1.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
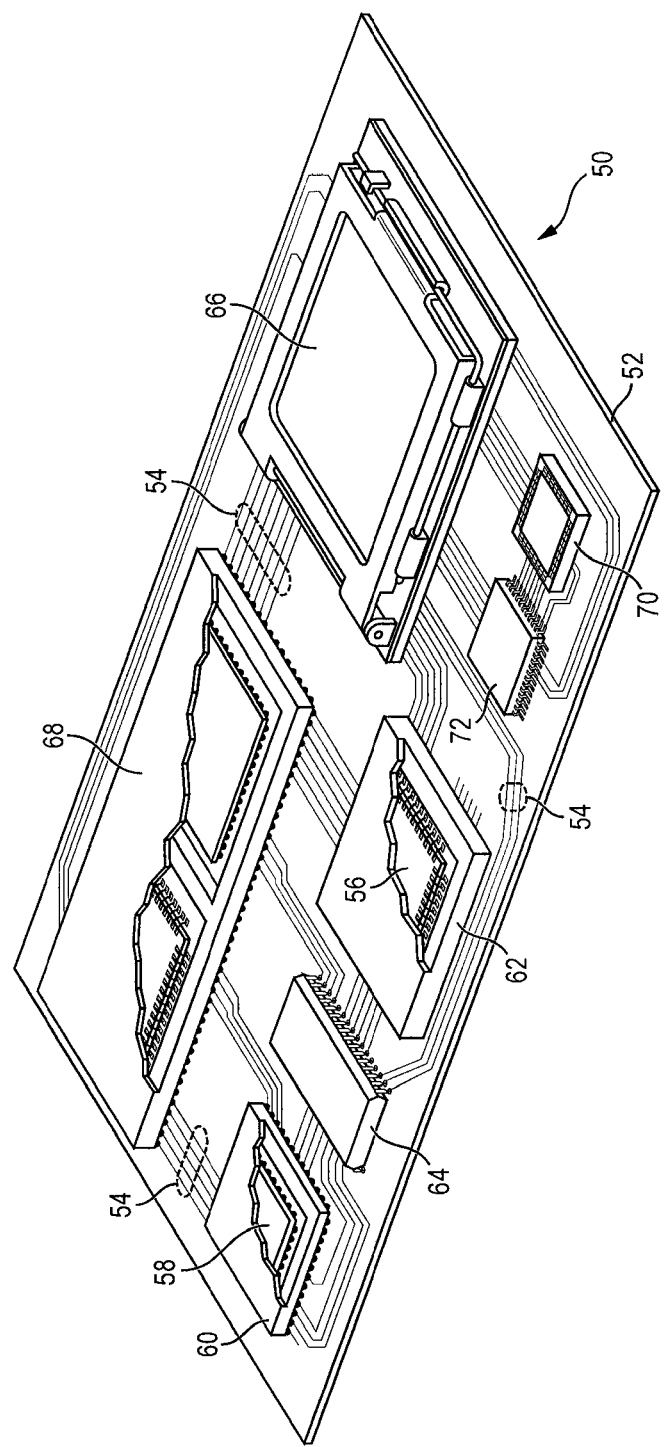
FIG. 3 illustrates a PCB with different types of packages mounted to its surface.

FIG. 3 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 3 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
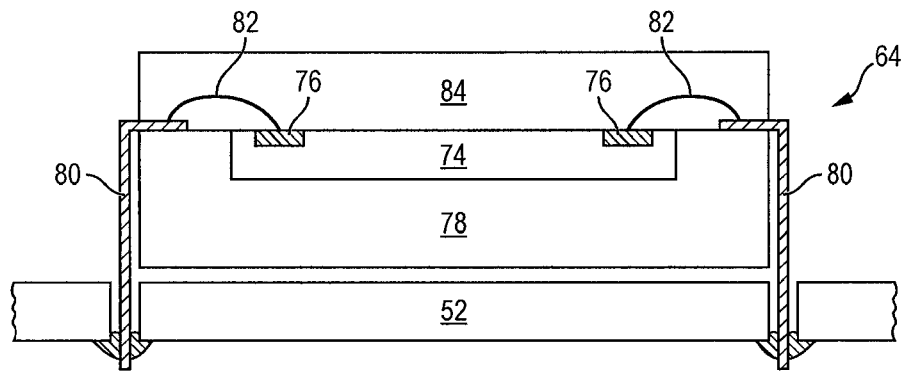
FIGS. 4a-4c illustrate further detail of the representative semiconductor packages mounted to the PCB.
Figure 4B:
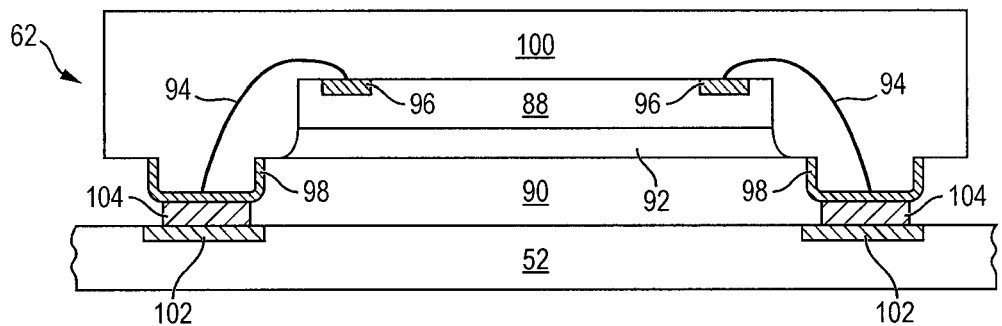
Figure 4C:
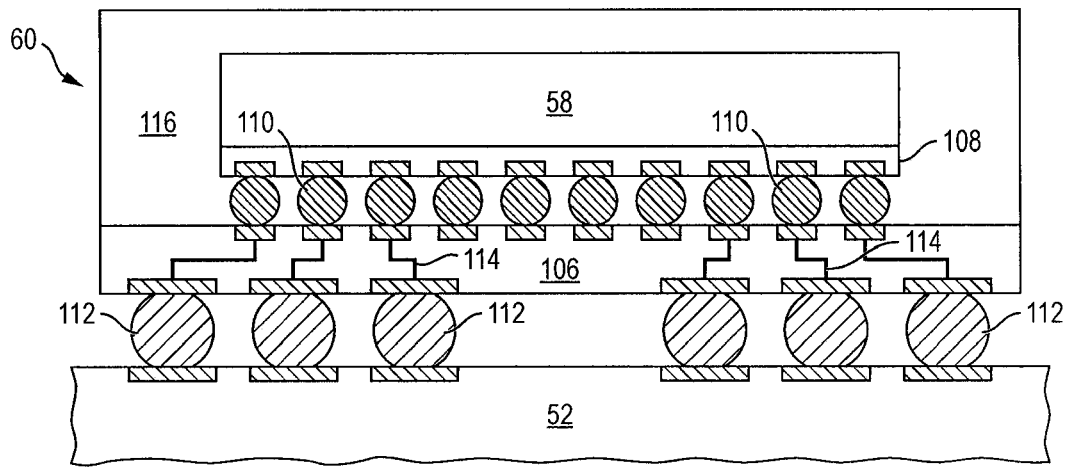

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 4b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 5:
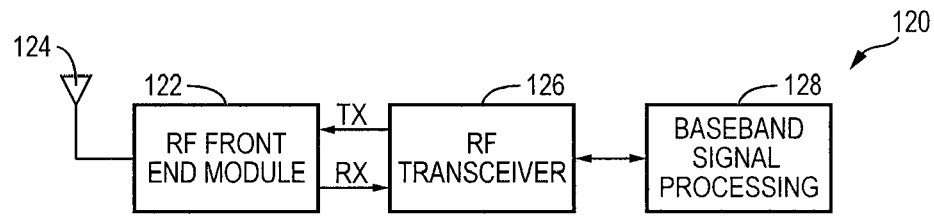
FIG. 5 illustrates an RF system with RF FEM, RF transceiver, and baseband signal processing for use in a wireless communication device.

FIG. 5 illustrates an RF system 120 including RF front end module (FEM) 122 coupled to antenna 124 for transmission and reception of wireless RF signals. RF FEM 122 separates and filters the transmit RF signal (Tx) and receive RF signal (Rx) to avoid conflict or cross-over between the RF signals. The Tx signal is received from and the Rx signal is routed to RF transceiver 126 for modulation, demodulation, and conversion to and from baseband signals. Baseband signal processing block 128 performs necessary electrical functions on the baseband signals. For example, baseband signal processing block 128 includes a digital signal processor (DSP), memory, and logic to perform the device functions. RF system 120 can be used in a cellular telephone, PDA, or other wireless communication device.

Figure 6:
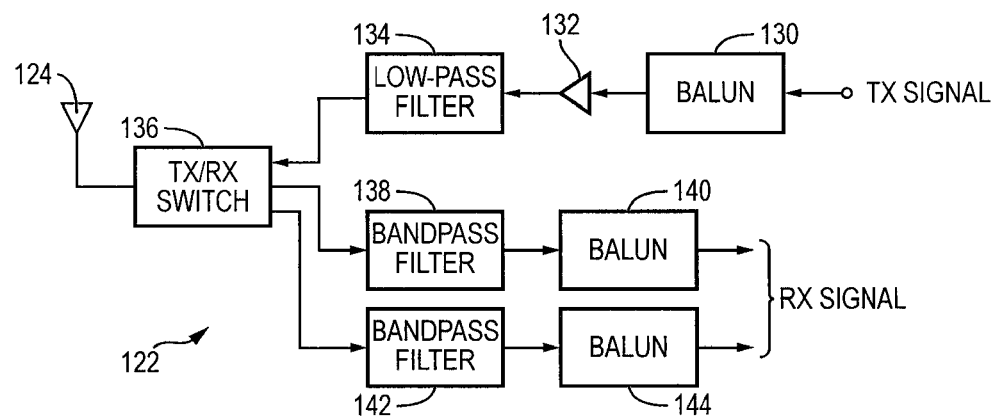
FIG. 6 illustrates a block diagram of the RF FEM in the RF system of FIG. 5.

FIG. 6 illustrates a block diagram of RF FEM 122. RF FEM 122 has a transmit section and receive section. In the transmit section, the modulated differential Tx signal from RF transceiver 126 is routed to balanced unbalanced (balun) circuit 130. Balun 130 translates the differential Tx signal to a single-ended Tx signal with impedance matching. The output of balun 130 is coupled to an input of power amplifier 132 to increase signal power and amplification. The amplified Tx signal from power amplifier 132 is routed to low-pass filter (LPF) 134. The filtered Tx signal is routed to Tx/Rx switch 136, which switches between the Tx signal and Rx signal. When selected by Tx/Rx switch 136, the Tx signal is routed to antenna 124 for transmission.

In a first receiver path of the receive section, the Rx signal from antenna 124 is processed through Tx/Rx switch 136 to bandpass filter (BPF) 138. The output of BPF filter 138 is coupled to balun 140, which translates the single-ended Rx signal to a differential Rx signal with impedance matching. In a second receiver path, the Rx signal from antenna 124 in a different selectivity range is processed through Tx/Rx switch 136 to BPF 142. The output of BPF filter 142 is coupled to balun 144, which translates the single-ended Rx signal to a differential Rx signal with impedance matching. The Rx signal is routed to RF transceiver 126 for demodulation and conversion to baseband for signal processing by block 128.

Figure 7A:
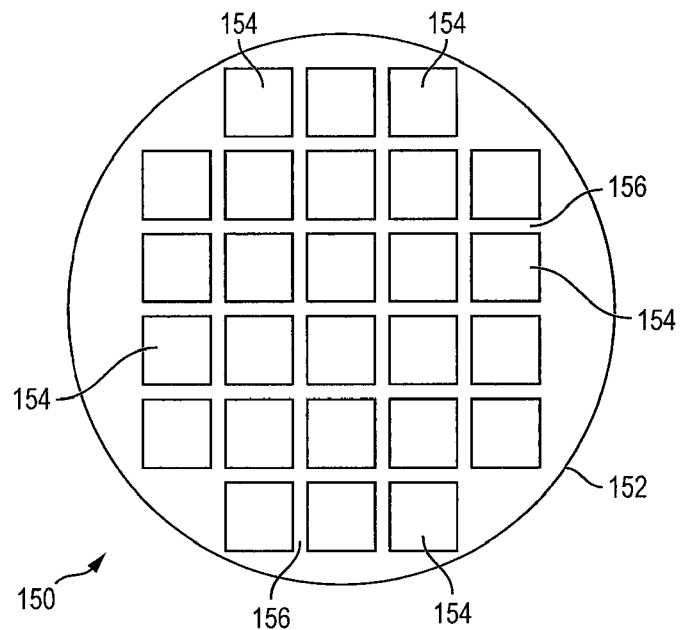

FIGS. 7a-7j illustrate, in relation to FIGS. 3 and 4a-4c, a process of forming an RF FEM and RF transceiver in a semiconductor package. In FIG. 7a, semiconductor wafer 150 contains a base substrate 152, such as silicon, germanium, gallium arsenide, indium phosphide, or silicon carbide for structural support. A plurality of semiconductor die or components 154 is formed on wafer 150 separated by a non-active, inter-die wafer area or saw street 156 as described above. Semiconductor wafer 150 can also be glass or electromagnetic casting (EMC). Semiconductor wafer 150 is singulated through saw street 156 using a saw blade or laser cutting tool into individual semiconductor die 154.

Figure 7B:
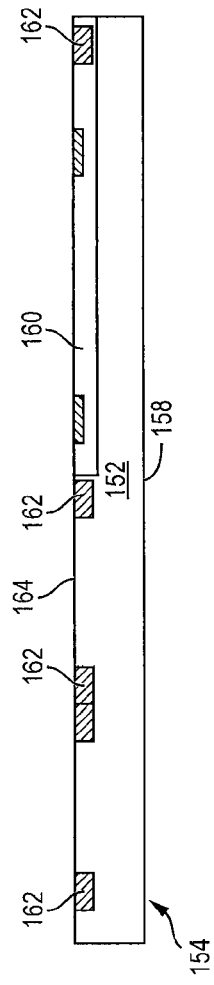
Figure 7C:
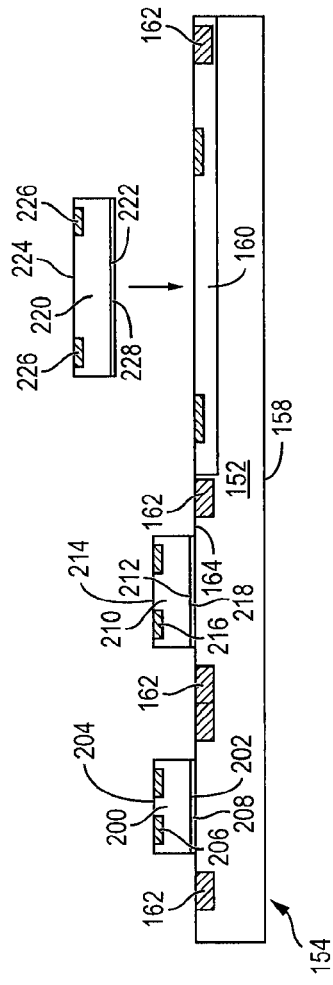

FIG. 7b shows one semiconductor die 154 with back surface 158 and active region 160 containing analog or digital circuits implemented as active devices, passive devices, conductive layers, and dielectric layers formed within the die and electrically interconnected according to the electrical design and function of the die. For example, the circuit contains integrated passive devices (IPDs), such as inductors, capacitors, and resistors, for RF signal processing. Semiconductor die 154 also includes one or more transistors, diodes, and other circuit elements formed within active region 160 to implement analog circuits or digital circuits. Active region 160 occupies about 5-10% of the overall thickness or height of semiconductor die 154. In one embodiment, semiconductor die 154 has a surface area of 3.7 millimeters (mm) by 3.7 mm.

An electrically conductive layer 162 is formed over active region 160 and surface 164 of substrate 152, opposite back surface 158 of the substrate, using PVD, CVD, electrolytic plating, electroless plating process, or other suitable metal deposition process. Conductive layer 162 can be one or more layers of Al, Cu, Sn, Ni, Au, Ag, or other suitable electrically conductive material. Conductive layer 162 operates as contact pads electrically connected to the circuits in active region 160.

Figure 8:
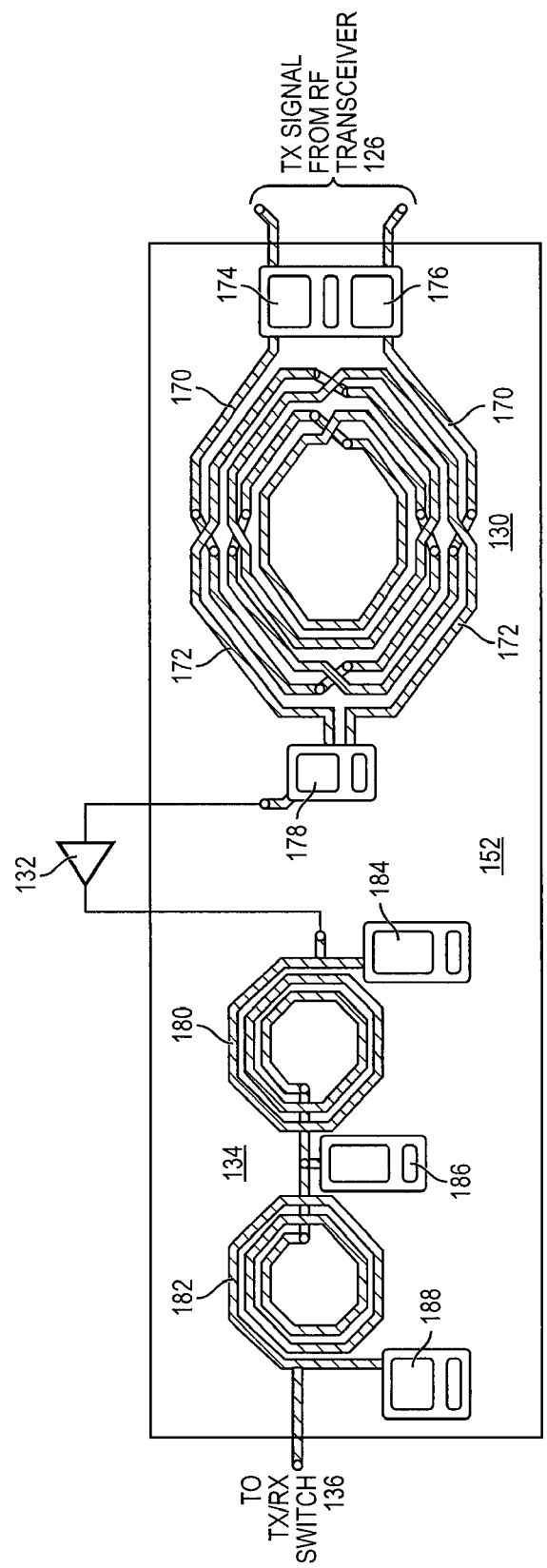
FIG. 8 illustrates a physical layout of an LPF and balun for the RF FEM.

In present embodiment, active region 160 is formed on a high resistivity silicon (HRS) substrate 152, on the order of 500-2000 ohms/sq. Active surface 160 of semiconductor die 154 contains IPDs, including balun 130 and LPF 134 of FIG. 6. Active surface 160 of semiconductor die 154 may also contain balun 140 and 144. FIG. 8 shows a physical layout of balun 130 and LPF 134 in a small form factor on common HRS substrate 152 of semiconductor die 154. In particular, balun 130 includes conductive traces or coils 170 and 172, and capacitors 174, 176, and 178 for the Tx signal. The conductive traces 170-172 are implemented with strip line conductive traces which are wound to exhibit inductive properties and interwoven to exhibit mutually inductive properties. Power amplifier 132 is shown coupled to an output of balun 130 and implemented off HRS substrate 152. The output of power amplifier 132 is coupled to an input of LPF 134. LPF 134 includes conductive traces or coils 180 and 182, and capacitors 184, 186, and 188 for the Tx signal. The conductive traces 180-182 are implemented with strip line conductive traces which are wound to exhibit inductive properties. The conductive traces 170-172 and 180-182 can be one or more layers of Al, Cu, Sn, Ni, Au, Ag, or other suitable electrically conductive material formed using sputtering, electrolytic plating, electroless plating process, or other suitable metal deposition process. In one embodiment, conductive traces 170-172 and 180-182 are 10-50 micrometers (μm) in width. The conductive traces 170-172 and 180-182 can be circular, oval, polygonal, or conformal shape for enhanced Q-factor and reduced die area. Capacitors 174-178 and 184-188 are implemented using a thin-film dielectric to increase capacitance density.

Figure 9:
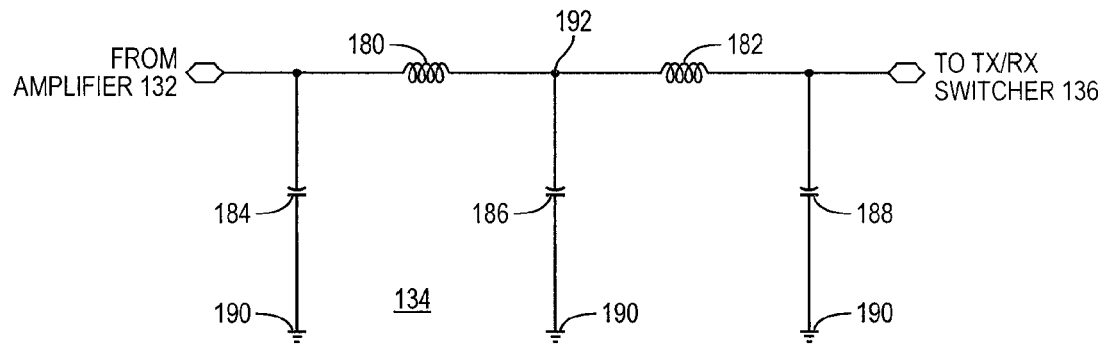
FIG. 9 illustrates a schematic circuit of the LPF for the RF FEM.

FIG. 9 shows an electrical schematic diagram of LPF 134 with inductors 180-182 and capacitors 184-188. In particular, capacitor 184 is coupled between a first end terminal of inductor 180 at an input of LPF 134 and a ground terminal 190. A second end terminal of inductor 180 is coupled to node 192. Capacitor 186 is coupled between node 192 and ground terminal 190. A first end terminal of inductor 182 is coupled to node 192. Capacitor 188 is coupled between a second end terminal of inductor 184 at an output of LPF 134 and ground terminal 190. The inductors 180-182 are wound to create relatively small mutual coupling between the inductors for high attenuation in the rejection band. For example, the value of inductor 180 is set to 2.2 nanohenries (nH), and the value of inductor 182 is set to 2.2 nH.

Figure 10:
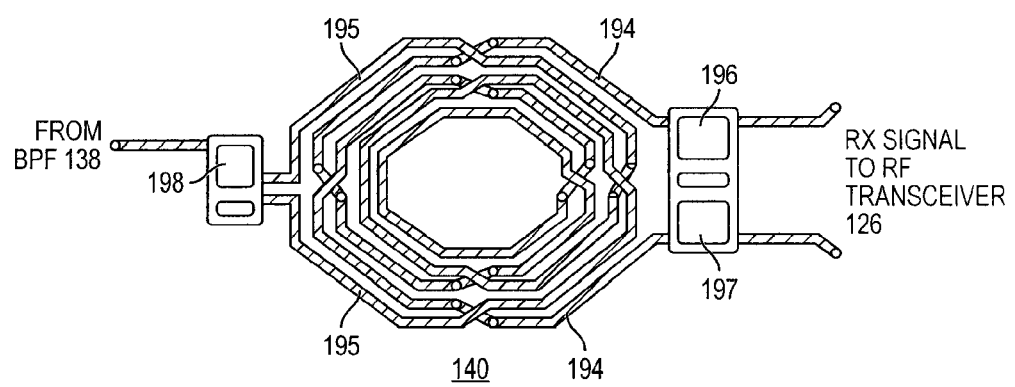
FIG. 10 illustrates a physical layout of a balun for the BPF.

FIG. 10 shows a physical layout of balun 140 and balun 144 in a small form factor on common HRS substrate 152 of semiconductor die 154. In particular, balun 140 includes conductive traces or coils 194 and 195, and capacitors 196, 197, and 198 for the Tx signal. The conductive traces 194-195 are implemented with strip line conductive traces which are wound to exhibit inductive properties and interwoven to exhibit mutually inductive properties. The conductive traces 194-195 can be one or more layers of Al, Cu, Sn, Ni, Au, Ag, or other suitable electrically conductive material formed using sputtering, electrolytic plating, electroless plating process, or other suitable metal deposition process. In one embodiment, conductive traces 194-195 are 10-50 µm in width. The conductive traces 194-195 can be circular, oval, polygonal, or conformal shape for enhanced Q-factor and reduced die area. Capacitors 196-198 are implemented using a thin-film dielectric to increase capacitance density.

Returning to FIG. 7c, semiconductor die 200 has a back surface 202 and active surface 204 containing analog or digital circuits implemented as active devices, passive devices, conductive layers, and dielectric layers formed within the die and electrically interconnected according to the electrical design and function of the die. For example, the circuit contains IPDs, such as inductors, capacitors, and resistors, for RF signal processing. Semiconductor die 200 also includes one or more transistors, diodes, and other circuit elements formed within active surface 204 to implement analog circuits or digital circuits. In one embodiment, semiconductor die 200 contains RF switching circuits for Tx/Rx switch 136 in FIG. 6. A plurality of contact pads 206 is formed on active surface 204 and electrically connected to circuits in the active surface. Semiconductor die 200 is mounted back surface 202 to surface 164 of HRS substrate 152 with die attach adhesive 208.

Semiconductor die 210 has a back surface 212 and active surface 214 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 214 to implement analog circuits or digital circuits. Semiconductor die 210 also contains IPDs, such as inductors, capacitors, and resistors, for RF signal processing. In one embodiment, semiconductor die 210 contains decoding logic and inverter circuits to set the proper bias levels to control the RF switching circuits for Tx/Rx switch 136. A plurality of contact pads 216 is formed on active surface 214 and electrically connected to circuits in the active surface. Semiconductor die 210 is mounted back surface 212 to surface 164 of HRS substrate 152 with die attach adhesive 218.

In another embodiment, the RF switching circuits and decoding logic and inverter circuits of Tx/Rx switch 136 can be implemented in a monolithic semiconductor die.

Semiconductor die 220 has a back surface 222 and active surface 224 containing analog or digital circuits implemented as active devices, passive devices, conductive layers, and dielectric layers formed within the die and electrically interconnected according to the electrical design and function of the die. For example, the circuit contains IPDs, such as inductors, capacitors, and resistors, for RF signal processing. Semiconductor die 220 may also include one or more transistors, diodes, and other circuit elements formed within active surface 224 to implement analog circuits or digital circuits. In the present embodiment, semiconductor die 220 contains BPF 138 and BPF 142 in FIG. 6 formed on a gallium arsenide (GaAs) substrate. A plurality of contact pads 226 is formed on active surface 224 and electrically connected to circuits in the active surface. Semiconductor die 220 is positioned back surface 222 to surface 164 of HRS substrate 152 for mounting with die attach adhesive 228.

Figure 7D:
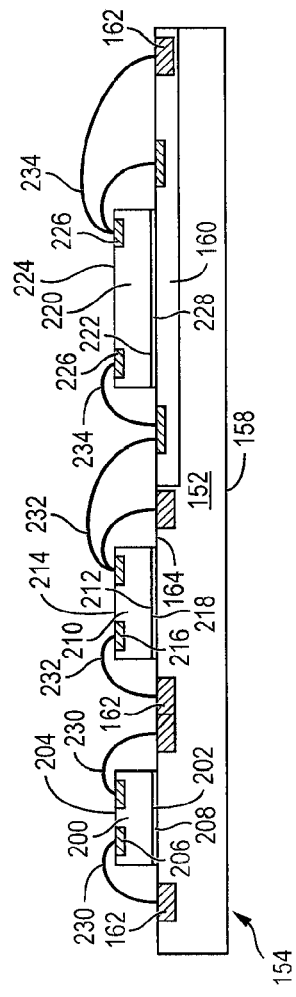

FIG. 7d shows semiconductor die 200, 210, and 220 mounted to surface 164 of HRS substrate 152. A plurality of bond wires 230 is formed between contact pads 206 of semiconductor die 200 and contact pads 162 on substrate 152. A plurality of bond wires 232 is formed between contact pads 216 of semiconductor die 210 and contact pads 162 on substrate 152. A plurality of bond wires 234 is formed between contact pads 226 of semiconductor die 220 and contact pads 162 on substrate 152.

Figure 11:
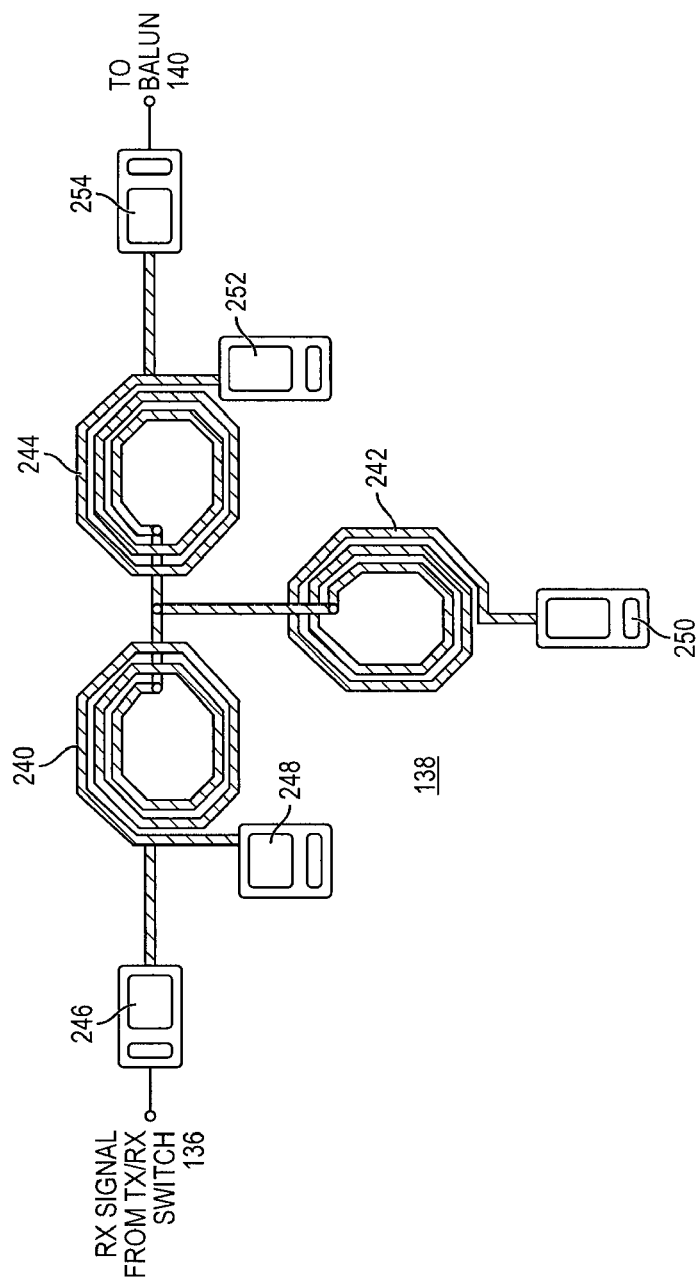
FIG. 11 illustrates a physical layout of a BPF for the RF FEM.

FIG. 11 shows a physical layout of BPF 138 or BPF 142 in FIG. 6 in a small form factor on a common GaAs substrate. In particular, BPF 138 includes conductive traces or coils 240, 242, and 244, and capacitors 246, 248, 250, 252, and 254 for the Rx signal. The conductive traces 240-244 are implemented with strip line conductive traces which are wound to exhibit inductive properties. The conductive traces 240-244 can be one or more layers of Al, Cu, Sn, Ni, Au, Ag, or other suitable electrically conductive material formed using sputtering, electrolytic plating, electroless plating process, or other suitable metal deposition process. In one embodiment, conductive traces 240-244 are 10-50 µm in width and 5-10 µm trace spacing. The conductive traces 240-244 can be circular, oval, polygonal, or conformal shape for enhanced Q-factor and reduced die area. Capacitors 246-254 are implemented using a thin-film dielectric to increase capacitance density.

Figure 12:
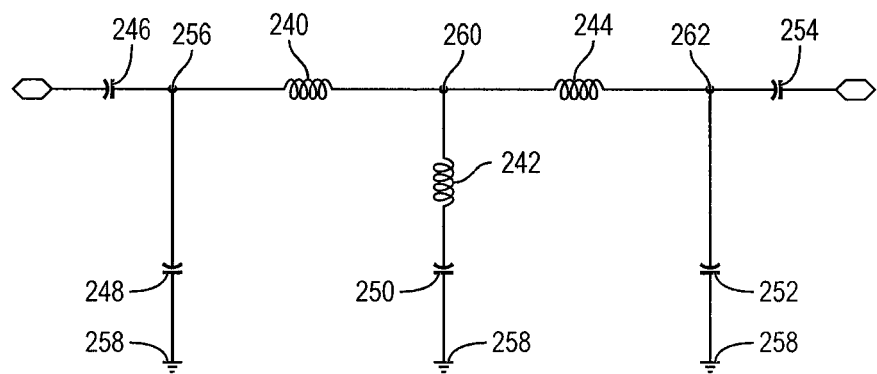
FIG. 12 illustrates a schematic circuit of the BPF for the RF FEM.

FIG. 12 shows an electrical schematic diagram of BPF 138 and 142 with inductors 240-244 and capacitors 246-254. In particular, capacitor 246 is coupled between an input of BPF 138 and node 256. Capacitor 248 is coupled between node 256 and a ground terminal 258. Inductor 240 is coupled between node 256 and node 260. Inductor 242 and capacitor 250 are coupled in series between node 260 and ground terminal 258. Inductor 244 is coupled between node 260 and node 262. Capacitor 254 is coupled between node 262 and an output of BPF 138. The inductors 240-244 are wound to create relatively small mutual coupling between the inductors for high attenuation in the rejection band. For example, the values of inductors 240, 242, and 244 are set to 0.56 nH.

Continuing with FIG. 7e, semiconductor die 270 has a back surface 272 and active surface 274 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 274 to implement analog circuits or digital circuits. Semiconductor die 270 may also contain IPDs, such as inductors, capacitors, and resistors, for RF signal processing. In the present embodiment, semiconductor die 270 contains RF transceiver 126 in FIG. 6. A plurality of contact pads 276 is formed on active surface 274 and electrically connected to circuits in the active surface. A plurality of bumps 278 is formed on contact pads 276. Semiconductor die 154, with mounted semiconductor die 200, 210, and 220, is positioned with back surface 158 oriented toward back surface 272 of semiconductor die 270. FIG. 7f shows the stacked semiconductor die 154, 200, 210, and 220 mounted to semiconductor die 270 with die attach adhesive 280.

In FIG. 7g, a substrate or printed circuit board 282 includes conductive layers 284 providing contacts pads and signal routing traces. A plurality of bumps 286 is formed on conductive layers 284 for electrical interconnect. The stacked semiconductor die 154, 200, 210, 220, and 270 are positioned over substrate 282 with bumps 278 aligned to conductive layers 284. FIG. 7h shows semiconductor die 154, 200, 210, 220, and 270 mounted to substrate 282 with bumps 278 electrically connected to conductive layer 284. A plurality of bond wires 288 is formed between contact pads 162 of substrate 152 and conductive layer 284 on substrate 282.

Figure 7I:
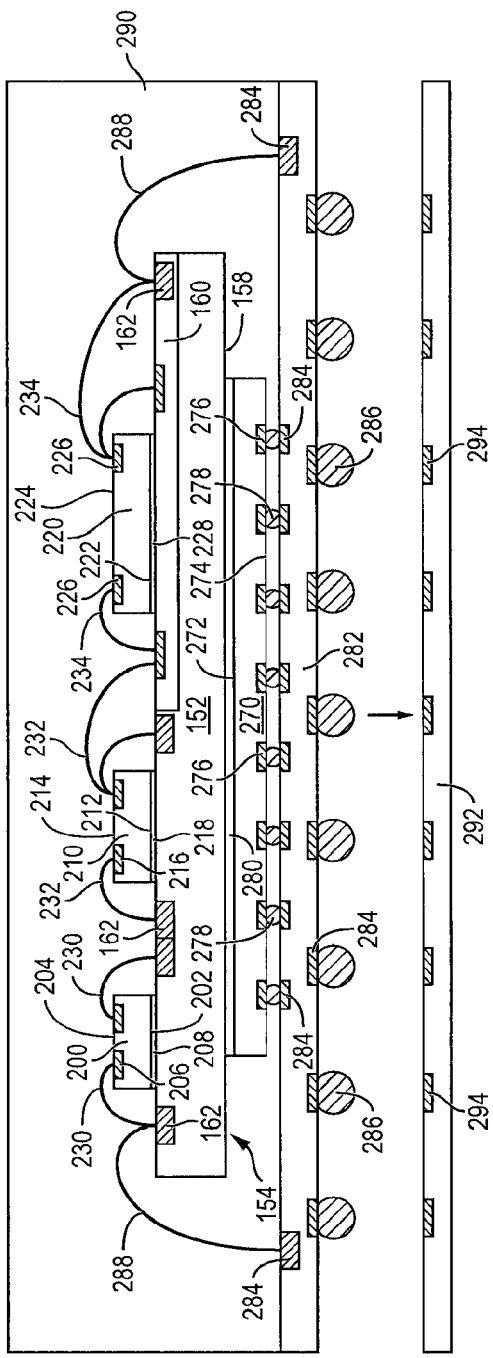

In FIG. 7i, an encapsulant or molding compound 290 is deposited over substrate 282 and the stacked semiconductor die 154, 200, 210, 220, and 270 using a paste printing, compressive molding, transfer molding, liquid encapsulant molding, vacuum lamination, or other suitable applicator. Encapsulant 290 can be polymer composite material, such as epoxy resin with filler, epoxy acrylate with filler, or polymer with proper filler. Encapsulant 290 is non-conductive and environmentally protects the semiconductor device from external elements and contaminants.

Figure 7J:
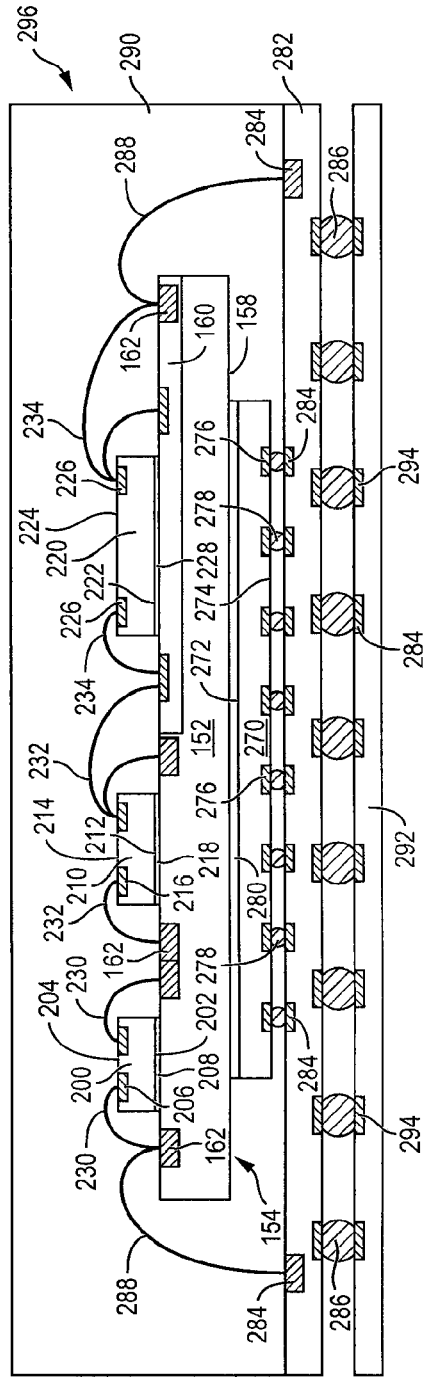

A substrate or printed circuit board 292 includes conductive layers 294 providing contacts pads and signal routing traces. The stacked semiconductor die 154, 200, 210, 220, and 270 and substrate 282 are positioned over substrate 292 with bumps 286 aligned to conductive layer 294. FIG. 7j shows the stacked semiconductor die 154, 200, 210, 220, and 270 and substrate 282 mounted to substrate 292 with bumps 286 electrically connected to conductive layer 294. The stacked semiconductor die 154, 200, 210, 220, and 270 over substrate 282 constitute RF semiconductor package 296.

RF Semiconductor package 296 contains IPDs and other RF signal processing components as described above can be used in high frequency applications, such as microwave radar, telecommunications, wireless communication, electronic switches, and other devices performing RF electrical functions. The IPDs provide the electrical characteristics for circuit functions such as baluns, resonators, high-pass filters, LPFs, BPFs, symmetric Hi-Q resonant transformers, matching networks, RF couplers, and tuning capacitors. For example, the IPDs can be used as front-end wireless RF components, which can be positioned between the antenna and transceiver. The wireless application can be a cellular phone using multiple band operation, such as wideband code division multiple access (WCDMA) bands (PCS, IMT, low) and global system mobile communication (GSM) bands (low and high).

In particular, RF semiconductor package 296 combines the features of FEM 122 and RF transceiver 126 within a package surface area of 5 mm×5 mm. RF semiconductor package 296 is well suited for the worldwide interoperability for microwave access protocol (mobile WiMAX) or WiBro in fixed and mobile Internet access. Power amplifier 132 can be integrated within semiconductor package 296 or implemented as a separate component. LPF 134 and baluns 130, 140, and 144 are implemented in semiconductor die 154. Power amplifier 132 can be integrated within semiconductor package 296 or implemented as a separate component. Tx/RX switch 136 is implemented in semiconductor die 200 and 210. BPFs 138 and 142 are implemented in semiconductor die 220 on a GaAs substrate.

Figure 13:
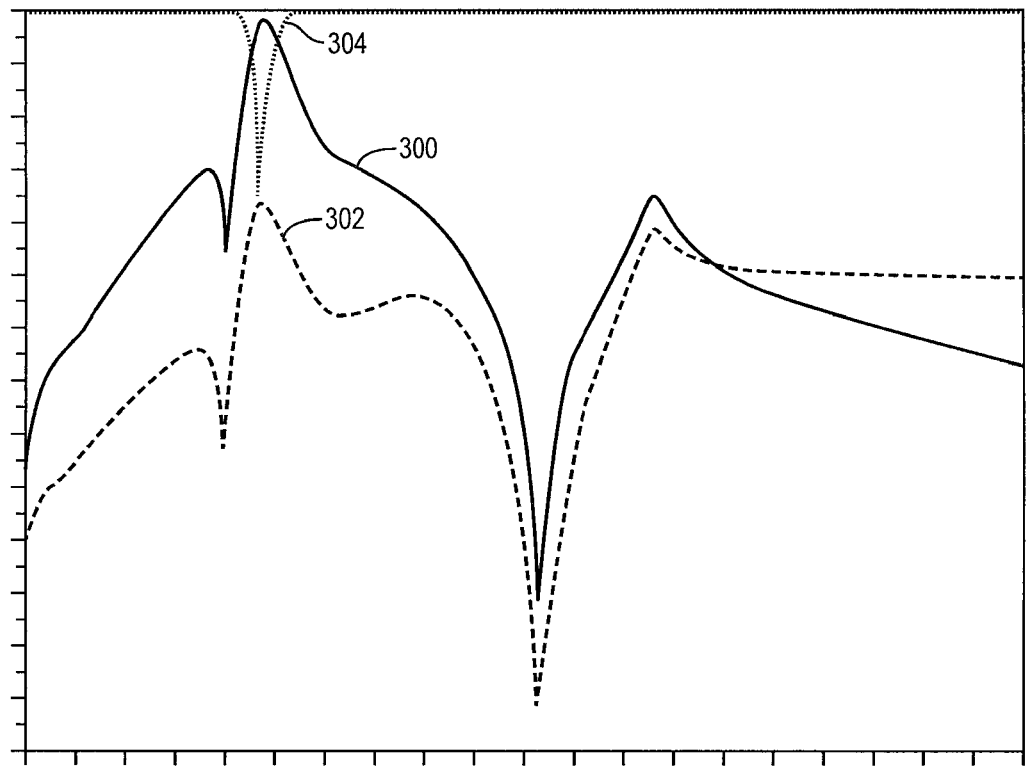
FIG. 13 illustrates waveform plots of the BPF for the RF FEM.

FIG. 13 shows waveform plots of BPFs 138 and 142 in dB versus frequency. Waveform 300 is insertion loss, waveform 302 is common mode rejection, and waveform 304 is return loss. BPFs 140 and 142 have a narrow pass band, e.g. 90 MHz, for the Rx signal in mobile WiBro applications. BPFs 138 and 142 have an insertion loss of 2.7 dB in the pass band (2.300-2.390 GHz) and attenuation of −35 dB at the second and third harmonic frequencies.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a first semiconductor die including a low pass filter, first balun, and second balun formed on a first surface of the first semiconductor die;
    providing a second semiconductor die including a bandpass filter;
    attaching the second semiconductor die to the first semiconductor die over the first surface of the first semiconductor die;
    providing a third semiconductor die including a radio frequency (RF) switch;
    attaching the third semiconductor die to the first semiconductor die over the first surface of the first semiconductor die adjacent to the second semiconductor die;
    providing a fourth semiconductor die including an RF transceiver; and
    attaching the fourth semiconductor die to a second surface of the first semiconductor die opposite the first surface of the first semiconductor die.

2. The method of claim 1, further including:
    providing a substrate; and
    disposing the first, second, third, and fourth semiconductor die over the substrate.

3. The method of claim 2, further including:
    forming a plurality of first bond wires between the second semiconductor die and first semiconductor die;
    forming a plurality of second bond wires between the third semiconductor die and first semiconductor die; and
    forming a plurality of third bond wires between the first semiconductor die and substrate.

4. The method of claim 1, wherein the first semiconductor die includes a high resistivity silicon substrate.

5. The method of claim 1, wherein forming the low pass filter further includes:
    forming a first conductive trace wound to exhibit inductive properties and coupled to an input of the low pass filter; and
    forming a second conductive trace wound to exhibit inductive properties and coupled to the first conductive trace and an output of the low pass filter.

6. The method of claim 1, wherein forming the bandpass filter further includes:
    forming a first conductive trace wound to exhibit inductive properties and coupled to an input of the bandpass filter;

forming a second conductive trace wound to exhibit inductive properties and coupled to the first conductive trace and a ground terminal; and forming a third conductive trace wound to exhibit inductive properties and coupled to the second conductive trace and an output of the bandpass filter.

7. The method of claim 1, wherein the second semiconductor die includes a gallium arsenide substrate.

8. A method of making a semiconductor device, comprising:

providing a first semiconductor die including a low pass filter and balun formed on a first surface of the first semiconductor die;

providing a second semiconductor die including a bandpass filter;

attaching the second semiconductor die to the first semiconductor die over the first surface of the first semiconductor die; and attaching a third semiconductor die to the first semiconductor die over the first surface of the first semiconductor die adjacent to the second semiconductor die.

9. The method of claim 8, further including:

providing a fourth semiconductor die including an RF transceiver; and disposing the first, second, and third semiconductor die over the fourth semiconductor die.

10. The method of claim 8, further including:

providing a substrate; and disposing the first, second, and third semiconductor die over the substrate.

11. The method of claim 8, wherein the first semiconductor die includes a high resistivity substrate.

12. The method of claim 8, further including forming a plurality of first bond wires between the second semiconductor die and first semiconductor die.

13. The method of claim 8, wherein forming the low pass filter further includes:

forming a first conductive trace wound to exhibit inductive properties and coupled to an input of the low pass filter; and forming a second conductive trace wound to exhibit inductive properties and coupled to the first conductive trace and an output of the low pass filter.

14. The method of claim 8, wherein forming the bandpass filter further includes:

forming a first conductive trace wound to exhibit inductive properties and coupled to an input of the bandpass filter;

forming a second conductive trace wound to exhibit inductive properties and coupled to the first conductive trace and a ground terminal; and forming a third conductive trace wound to exhibit inductive properties and coupled to the second conductive trace and an output of the bandpass filter.

15. The method of claim 8, wherein the second semiconductor die includes a gallium arsenide substrate.

16. The method of claim 8, wherein the third semiconductor die includes a radio frequency (RF) switch.

17. A method of making a semiconductor device, comprising:

providing a first semiconductor die including a low pass filter and balun;

providing a second semiconductor die including a radio frequency (RF) circuit; and disposing the second semiconductor die over the first semiconductor die.

18. The method of claim 17, further including:

providing a third semiconductor die including an RF transceiver; and disposing the first and second semiconductor die over the third semiconductor die.

19. The method of claim 18, further including:

providing a substrate; and disposing the first, second, and third semiconductor die over the substrate.

20. The method of claim 17, wherein the second semiconductor die includes a gallium arsenide substrate.

21. The method of claim 17, wherein the first semiconductor die includes a high resistivity substrate.

22. The method of claim 17, further including forming a plurality of first bond wires between the second semiconductor die and first semiconductor die.

23. The method of claim 17, wherein the RF circuit includes a bandpass filter.

24. The method of claim 23, wherein forming the bandpass filter further includes:

forming a first conductive trace wound to exhibit inductive properties and coupled to an input of the bandpass filter;

forming a second conductive trace wound to exhibit inductive properties and coupled to the first conductive trace and a ground terminal; and forming a third conductive trace wound to exhibit inductive properties and coupled to the second conductive trace and an output of the bandpass filter.

25. The method of claim 17, further including disposing a third semiconductor die including an RF switch over the first semiconductor die.

26. A semiconductor device, comprising:

a first semiconductor die including a low pass filter and balun formed on a first surface of the first semiconductor die;

an adhesive layer formed over the first surface of the first semiconductor die; and a second semiconductor die including a bandpass filter mounted to the first surface of the first semiconductor die over the adhesive layer.

27. The semiconductor device of claim 26, further including:

a third semiconductor die including a radio frequency (RF) switch disposed over the first semiconductor die; and a fourth semiconductor die including an RF transceiver, wherein the first, second, and third semiconductor die are disposed over the fourth semiconductor die.

28. The semiconductor device of claim 26, further including a substrate disposed over the first semiconductor die opposite the second semiconductor die.

29. The semiconductor device of claim 26, wherein the second semiconductor die includes a gallium arsenide substrate.

30. The semiconductor device of claim 26, wherein the first semiconductor die includes a high resistivity silicon substrate.

* * * * *